United States Patent
Sumant et al.

(10) Patent No.: US 10,351,429 B2
(45) Date of Patent: Jul. 16, 2019

(54) DIRECT SYNTHESIS OF REDUCED GRAPHENE OXIDE FILMS ON DIELECTRIC SUBSTRATES

(71) Applicant: UChicago Argonne, LLC, Chicago, IL (US)

(72) Inventors: Anirudha V. Sumant, Plainfield, IL (US); Richard Gulotty, Oak Park, IL (US)

(73) Assignee: UChicago Argonne, LLC, Chicago, IL (US)

(*) Notice: Subject to any disclaimer, the term of this patent is extended or adjusted under 35 U.S.C. 154(b) by 0 days.

(21) Appl. No.: 14/711,335

(22) Filed: May 13, 2015

(65) Prior Publication Data

US 2016/0332885 A1    Nov. 17, 2016

(51) Int. Cl.
| | |
|---|---|
| C01B 31/04 | (2006.01) |
| C23C 16/26 | (2006.01) |
| C23C 16/44 | (2006.01) |
| C23C 16/52 | (2006.01) |
| H01B 1/04 | (2006.01) |
| C23C 16/455 | (2006.01) |
| C01B 32/23 | (2017.01) |

(52) U.S. Cl.
CPC ............ C01B 31/043 (2013.01); C01B 32/23 (2017.08); C23C 16/26 (2013.01); C23C 16/4408 (2013.01); C23C 16/45557 (2013.01); C23C 16/52 (2013.01); H01B 1/04 (2013.01)

(58) Field of Classification Search
None
See application file for complete search history.

(56) References Cited

U.S. PATENT DOCUMENTS

| | | | |
|---|---|---|---|
| 2011/0068290 A1* | 3/2011 | Haddon | C12Q 1/6881 252/62.51 R |
| 2013/0243969 A1* | 9/2013 | Teng | B82Y 40/00 427/539 |
| 2013/0306361 A1* | 11/2013 | Kim | H05K 1/097 174/257 |
| 2013/0323158 A1 | 12/2013 | Xu et al. | |

(Continued)

OTHER PUBLICATIONS

Huang et al. "The mechanism of graphene oxide as a grwoth template for complete reduced graphene oxide coverage on an SiO2 substrate" Journal of Materials Chem C 2014 2 109.*

(Continued)

Primary Examiner — Mandy C Louie
(74) Attorney, Agent, or Firm — Foley & Lardner LLP

(57) ABSTRACT

A method for coating a dielectric substrate with a R-GO film includes positioning the dielectric substrate in a chamber which is purged with a first gas to adjust a pressure of the chamber to a first pressure. A second gas at a second flow rate and a third gas at a third flow rate is inserted into the chamber to increase the chamber pressure to a second pressure greater than the first pressure. A chamber temperature is increased to a first temperature. The flow of the second gas and the third gas is stopped. The chamber is purged to a third pressure higher than the first pressure and lower than the second pressure. The pressure of the chamber is set at a fourth pressure greater than the first pressure and the third pressure. A fourth gas is inserted into the chamber at a fourth flow rate for a first time.

20 Claims, 15 Drawing Sheets

(56) References Cited

U.S. PATENT DOCUMENTS

| | | | |
|---|---|---|---|
| 2014/0045058 A1* | 2/2014 | Zhao | H01M 4/134 |
| | | | 429/211 |
| 2014/0120270 A1 | 5/2014 | Tour et al. | |
| 2014/0178688 A1* | 6/2014 | Tour | C01B 31/0453 |
| | | | 428/408 |
| 2014/0287155 A1* | 9/2014 | Matsumoto | B01J 23/75 |
| | | | 427/535 |
| 2016/0019995 A1* | 1/2016 | Zhamu | H01B 1/04 |
| | | | 428/219 |

OTHER PUBLICATIONS

Tan, Andrew "Optimization of chemcial vapor deposition grown graphene" Linfield College thesis, May 2014.*
K. Andre Mkhoyan "Atomic and Electronic structrure of graphene-oxide" Nano letters 2009 vol. 9 No. 3, p. 1058-1063.*
J.D. Renteria "Anisotropy of thermal conductivity of free standing reduced graphene oxide films annealed at high temperature" University of California—Riverside and Graphenea Mar 25, 2015. p. 1-28.*
Pollard, Benjamin, Growing Graphene Via Chemical Vapor Deposition, Pomona College, http://physastro.pomona.edu/wp-content/uploads/2012/09/thesis_pollard.pdf, Sep. 2012, 47 pages.

* cited by examiner

FIG. 6A
FIG. 6B
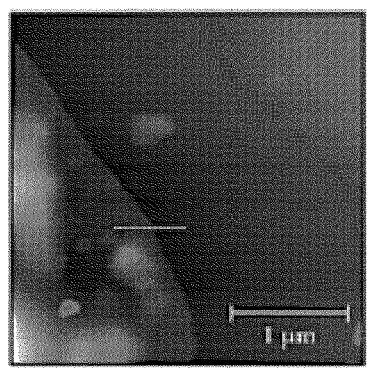
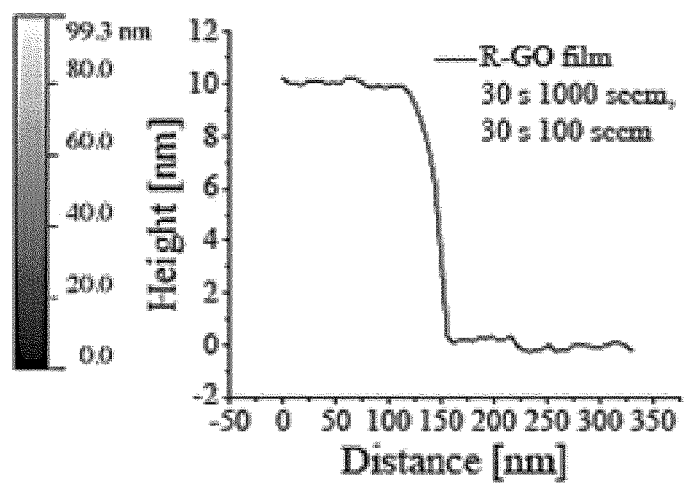
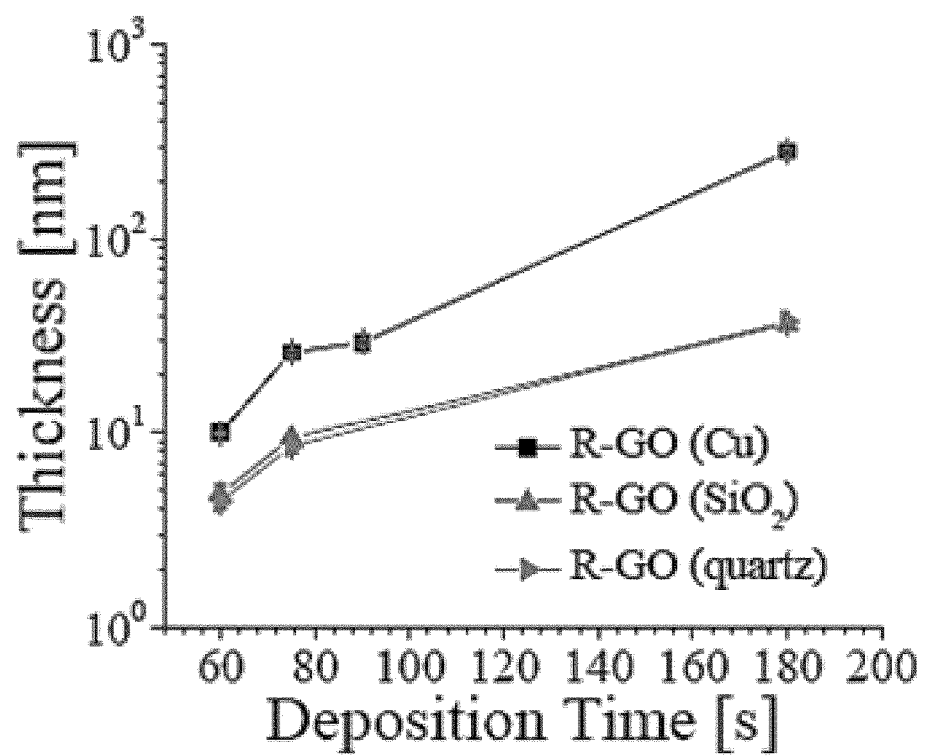
FIG. 6C

DIRECT SYNTHESIS OF REDUCED GRAPHENE OXIDE FILMS ON DIELECTRIC SUBSTRATES

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to methods for fabricating reduced graphene oxide (R-GO) films.

BACKGROUND

The superior electrical, thermal, optical and mechanical properties of graphene make it an attractive material for a variety of applications, for example, electronics, semi-conductors, heat transfer applications, reinforcing structures, etc. Moreover graphene films possess superior optical transmittance and electrical conductance over commercially applied transparent conducting films such as indium tin oxide (ITO). Therefore, significant efforts have been directed toward developing controllable and sustainable processes for large-scale growth of high-quality graphene.

Conventional processes for manufacturing graphene or R-GO which has the chemical formula $C_xO_yH_z$, involve a metal catalyst for growing graphene or R-GO using a chemical vapor deposition (CVD) process. Graphene is conventionally separated from the metal substrate by exfoliation or by removing the substrate. However, direct deposition of R-GO films on non-electric substrates (e.g., dielectric materials or polymeric materials) is particularly challenging. Particularly, it is difficult to form large area, continuous and uniform R-GO films on dielectric substrate.

SUMMARY

Embodiments described herein relate generally to systems and methods for forming R-GO films, and in particular to methods of depositing large area, continuous and uniform R-GO films on dielectric substrates.

In some embodiments, a method for coating a dielectric substrate with a R-GO film includes positioning the dielectric substrate in a chamber. The chamber is purged with a first gas to adjust a pressure of the chamber to a first pressure. A second gas is inserted at a second flow rate and a third gas is inserted at a third flow rate into the chamber to increase the pressure inside the chamber to a second pressure. The second pressure is greater than the first pressure. A temperature of the chamber is increased to a first temperature. The flow of the second gas onto the chamber is stopped. Furthermore, the flow of the third gas into the chamber is stopped. The chamber is purged to a third pressure which is higher than the first pressure and lower than the second pressure. The pressure of the chamber is set at a fourth pressure which is greater than the first pressure and the third pressure. A fourth gas is inserted into the chamber at a fourth flow rate for a first time.

In some embodiments, a method for forming a transparent electrode includes providing a transparent dielectric substrate. The transparent dielectric substrate is positioned in a chamber. The chamber is purged with nitrogen to adjust a pressure of the chamber to a first pressure. Hydrogen is inserted at a second flow rate and argon is inserted at a third flow rate into the chamber to increase the pressure inside the chamber to a second pressure. The second pressure is greater than the first pressure. A temperature of the chamber is increased to a first temperature. The flow of hydrogen into the chamber is stopped. Furthermore, the flow of argon into the chamber is stopped. The chamber is purged to a third pressure which is higher than the first pressure and lower than the second pressure. The pressure of the chamber is set at a fourth pressure which is greater than the first pressure and the third pressure. Methane is inserted into the chamber at fourth flow rate for a first time to deposit a predetermined thickness of an electrically conductive R-GO film on the transparent dielectric substrate. The R-GO film has an optical transmittance of at least 80% at a thickness of up to about 5 nm.

In some embodiments, a method of enhancing heat transfer from an electronic device includes depositing a R-GO film on the electronic device. The R-GO film is deposited by positioning the electronic device in a chamber. The chamber is purged with nitrogen to adjust a pressure of the chamber to a first pressure. Hydrogen is inserted at a second flow rate and argon is inserted at a third flow rate into the chamber to increase the pressure inside the chamber to a second pressure. The second pressure is greater than the first pressure.

A temperature of the chamber is increased to a first temperature. The flow of hydrogen into the chamber is stopped. Furthermore, the flow of argon into the chamber is stopped. The chamber is purged to a third pressure which is higher than the first pressure and lower than the second pressure. The pressure of the chamber is set at a fourth pressure which is greater than the first pressure and the third pressure. Methane is inserted into the chamber at fourth flow rate for a first time to deposit a predetermined thickness of a R-GO film on the electronic device. The reduced graphene oxide film has a thermal conductivity in the range of 60 W/m-K to 120 W/m-K.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 6A is an atomic force microscope (AFM) image of a R-GO film deposited on copper then transferred to $SiO_2$ (scale bar 300 nm), revealing a cross-sectional profile of the R-GO film; FIG. 6B is a plot of the R-GO film thickness determined from the AFM image; FIG. 6C is a plot of AFM various R-GO film thicknesses achieved by varying deposition time on copper, $SiO_2$ and quartz substrates.

Figure 1:
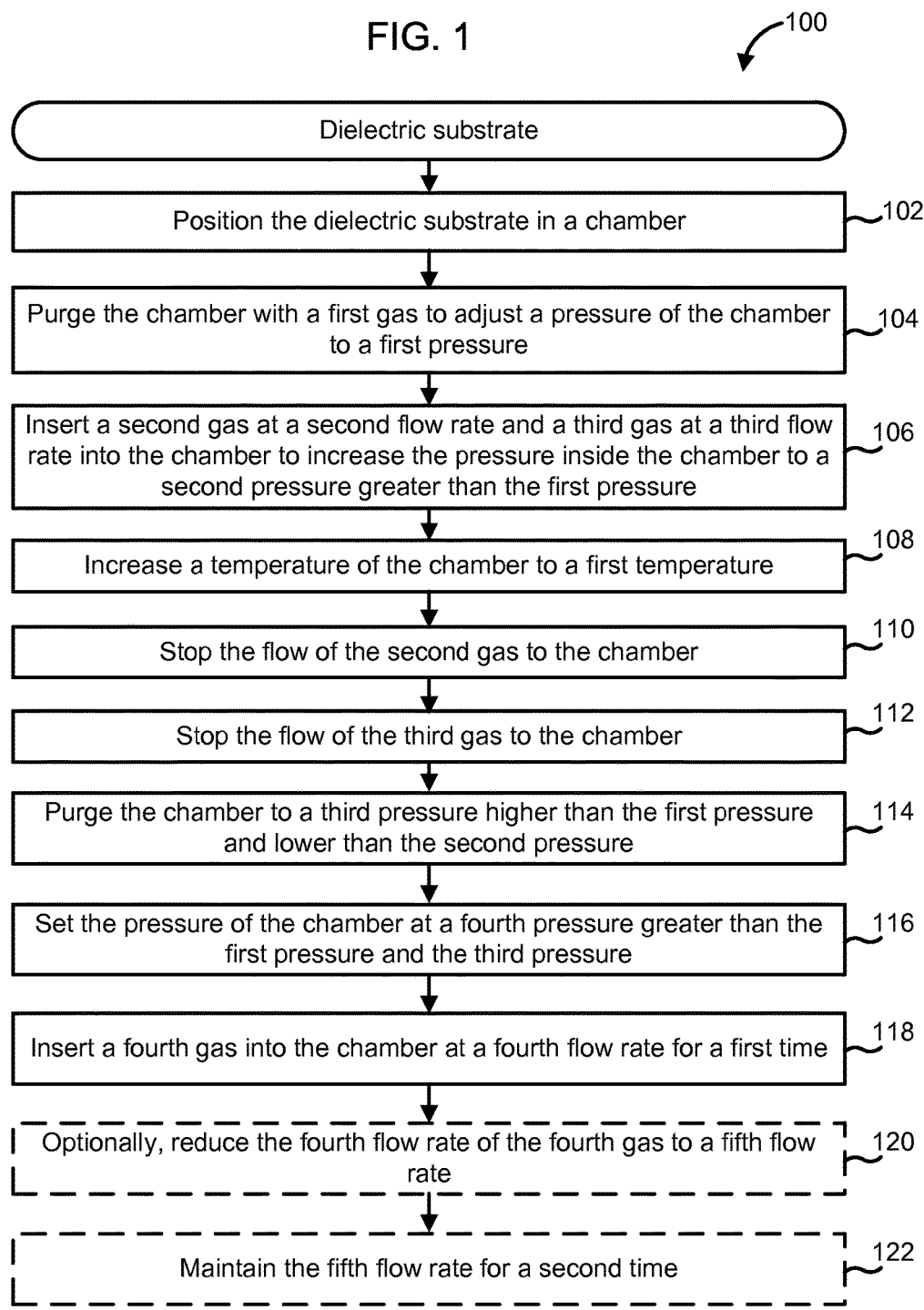
FIG. 1 is a schematic flow diagram of an exemplary method for coating a dielectric substrate with a R-GO film, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and methods for forming R-GO films, and in particular to methods of depositing large area, continuous and uniform R-GO films on dielectric substrates.

Embodiments of the R-GO films formed on dielectric substrates and methods to form such films provides numerous benefits including, for example: (1) forming R-GO films without the use of metal catalyst; (2) allowing deposition of the ordered R-GO films on large area substrates without the use of high temperature annealing; (3) providing flexibility in using the same method to deposit the R-GO film on metallic substrates; (4) tuning the thickness of the R-GO film by controlling the flow rate of precursor gases employed in the CVD process, or varying the deposition time; and (5) providing superior thermal conductivity, optical transmittance and electrical properties relative to R-GO films formed using conventional methods.

FIG. 1 is a schematic flow diagram of an exemplary method 100 for depositing a R-GO film on dielectric substrate. Any dielectric substrate which can withstand the maximum temperature reached during the operations included in the method 100 can be used. Suitable dielectric substrates can include, for example, SiO$_2$ quartz, fused silica, silicon nitride, sapphire, magnesium oxide, etc. The dielectric substrate can have any shape or size, for example a block, a sheet, a wafer (e.g., a 2 inch, 3 inch, 4 inch, 6 inch, 12 inch or even larger wafer), contoured shape or any other suitable shape or size which can be fit inside a chamber, as described herein.

The method 100 includes positioning the dielectric substrate in a chamber at 102. The chamber can include, for example a CVD chamber or a CVD tube as is commonly known in the arts. The chamber is purged with a first gas to adjust a pressure of the chamber to a first pressure at 104. In some embodiments, the gas can include an inert gas such as nitrogen. In particular embodiments, the first pressure can be in the range of 5 mTorr to 100 mTorr (e.g., 5 mTorr, 6 mTorr, 7 mTorr, 8 mTorr, 9 mTorr, 10 mTorr, 12 mTorr, 14 mTorr, 16 mTorr, 18 mTorr, 20 mTorr, 30 mTorr, 40 mTorr, 50 mTorr, 60 mTorr, 70 mTorr, 80 mTorr, 90 mTorr or 100 mTorr inclusive of all ranges and values therebetween). In one embodiment, the first pressure is about 10 mTorr. Insertion of the inert first gas can facilitate the purging of reactive gases such as oxygen, carbon dioxide, air, etc. from the tube to prevent any side reactions or deposition of contaminants on surface of the dielectric substrate.

A second gas is inserted at a second flow rate and a third gas is inserted at a third flow rate into the chamber to increase the pressure of the chamber to a second pressure which is greater than the first pressure at 106. In some embodiments, the third gas is hydrogen and the fourth gas is an inert gas (e.g., argon, xenon, helium, radon, nitrogen, etc.). In particular embodiments, the second gas is hydrogen and the third gas is argon. Each of the first flow rate and the second flow rate can be in the range of 500 sccm to 2,000 sccm (e.g., 500 sccm, 600 sccm, 700 sccm, 800 sccm, 900 sccm, 1,000 sccm, 1,100 sccm, 1,200 sccm, 1,300 sccm, 1,400 sccm, 1,500 sccm, 1,600 sccm, 1,700 sccm, 1,800 sccm, 1,900 sccm or 2,000 sccm inclusive of all ranges and values there between).

In one embodiment, the first flow rate of the second gas, and the second flow rate of the third gas are about 1,000 sccm. Furthermore, the second pressure can be in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values therebetween). In one embodiment, the second pressure is about 300 Torr.

A temperature of the chamber is increased to a first temperature at 108. In some embodiments, the first temperature is in the range of 800 degrees Celsius to 1,200 degrees Celsius (e.g., 800, 850, 900, 950, 1,000, 1,100, 1,150 or 1,200 degrees Celsius inclusive of all ranges and values there between). In one embodiment, the first temperature is about 950 degrees Celsius.

The flow of the first gas into the chamber is stopped at 110. Furthermore, the flow of the second gas into the chamber is stopped at 112. In one embodiment, the flow of the first gas and the second gas is stopped simultaneously. In another embodiment, the flow of the first gas is stopped first followed by stopping of the flow of the second gas. In still another embodiment, the flow of the second gas is stopped first followed by the stopping of the flow of the first gas.

The chamber is purged to a third pressure which is higher than the first pressure and is lower than the second pressure at 114. In some embodiments, the third pressure is 500 mTorr to 5 Torr (e.g., 500 mTorr, 600 mTorr, 700 mTorr, 800 mTorr, 900 mTorr, 1 Torr, 2 Torr, 3 Torr, 4 Torr or 5 Torr inclusive of all ranges and values therebetween). In one embodiment, the third pressure is about 1 Torr. The purging can remove substantially all of the second gas and third gas from the chamber. As described herein, "substantially all" means that it is possible that a de minimus amount of the second gas and the third gas remains in the chamber after purging which can be associated with imperfections associated with chamber sealing or pumping equipment, as would be understood by one of ordinary skill in the art.

The pressure of the chamber is set to a fourth pressure which is greater than the first pressure and the third pressure at 116. In some embodiments, the fourth pressure is in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values there between). In particular embodiments, the fourth pressure is the same as the second pressure. In one embodiment, the fourth pressure is about 300 Torr.

A fourth gas is inserted into the chamber at a fourth flow rate for a first time at 118, which results in deposition of a predetermined thickness of R-GO on the dielectric substrate. The fourth gas can include any suitable source of carbon such as methane, ethylene, ethane, or any other hydrocarbon containing gas. In one embodiment, the fourth gas includes methane. Furthermore, the fourth flow rate of the fourth gas can be 800 sccm to 1,200 sccm (e.g., 800 sccm, 850 sccm, 900 sccm, 950 sccm, 1,000 sccm, 1,050 sccm, 1,100 sccm, 1,150 sccm, or 1,200 sccm inclusive of all ranges and values therebetween). In one embodiment, the fourth flow rate is about 1,000 sccm. The first time and/or the fourth flow rate can be varied to deposit a varying thicknesses of R-GO on the dielectric substrate.

Expanding further, in some embodiments, the second gas (e.g., hydrogen) can modify the surface of the substrate (e.g., create dangling hydrogen bonds or alter a surface roughness) to facilitate deposition of the R-GO film on the substrate. In some embodiments, the second gas (e.g., hydrogen) can catalyze the decomposition of the fourth gas into carbon atoms and facilitate deposition of the carbon atoms on the surface of the dielectric in an ordered matrix comprising the R-GO film. The first temperature (e.g., about 950 degrees Celsius) can be sufficient to allow pyrolysis of the fourth gas (e.g., methane) to yield precursors which deposit on the surface of the dielectric substrate to form the R-GO film.

Moreover, the presence of argon and hydrogen flow can help to prevent evaporation of the substrate and also facilitate removal of any residues from the dielectric substrate before the growth phase. In particular embodiments, the hydrogen gas serves as the active gas for removing residue from the dielectric substrate, while argon serves to maintain the pressure within the chamber. Venting the chamber to the low temperature (e.g., the fourth pressure) and/or heating the dielectric substrate to a high temperature (e.g., the first temperature) can impact the surface morphology of the dielectric substrate.

In some embodiments, method 100 can also include reducing the fourth flow rate of the fourth gas to a fifth flow rate lower than the fourth flow rate at 120. For example, the fifth flow rate can be in the range of about 50 sccm to about 150 sccm (e.g., about 50 sccm, 60 sccm, 70 sccm, 80 sccm, 90 sccm, 100 sccm, 110 sccm, 120 sccm, 130 sccm, 140 sccm or 150 sccm inclusive of all ranges and values therebetween). The fifth flow rate is maintained for a second time at 122, to deposit the predetermined thickness of R-GO on the dielectric substrate. In one embodiment, the fifth flow rate is about 100 sccm. The higher fourth flow rate can contribute to initial rapid deposition of the R-GO film, and the lower fifth flow rate can provide greater control over the thickness of the R-GO film deposited on the dielectric substrate. The pressure within the chamber can reach about 50 Torr during operations 118-122.

In particular embodiments, the R-GO coated dielectric substrate can be cooled at a pressure of about 300 Torr within the chamber. Hydrogen at a flow rate of about 1,000 sccm and argon also at a flow rate of about 1,000 sccm can be inserted into the chamber during the ramp of the pressure to the pressure of about 300 Torr. The dielectric substrate can be removed from the chamber in an atmosphere of an inert gas (e.g., nitrogen) at a temperature of less than or equal to 100 degrees Celsius.

The R-GO film deposited on the dielectric substrate obtained using the method 100 has superior mechanical, optical, electrical and thermal properties relative to R-GO films prepared using conventional methods. The R-GO film can be composed of clusters of carbon having in the range of 45% to 70% sp3 bonding. Furthermore, the oxygen content in the R-GO film can be 30% to 50% lower than conventional R-GO films.

In some embodiments, the R-GO film can have an optical transmittance of at least 80% at a thickness of the film of up to about 5 nm. The optical transmittance has only a week dependence on the optical wavelength. The sheet resistance of the R-GO film can approach that of a pristine multilayer graphene. In some embodiments, the R-GO film has a sheet resistance of 5 kOhm/square to 10 kOhm/square (e.g., 5, 6, 7, 8, 9 or 10 kOhm/square inclusive of all ranges and values there between). In some embodiments, the R-GO film formed using the method 100 has a thermal conductivity in the range of 60 W/m-K to 120 W/m-K (e.g., 60, 70, 80, 90, 100, 110 or 120 W/m-K inclusive of all ranges and values therebetween). In one embodiment, the R-GO film formed using the method 100 can have a thermal conductivity of 91.4±21.7 W/m-K.

Figure 2:
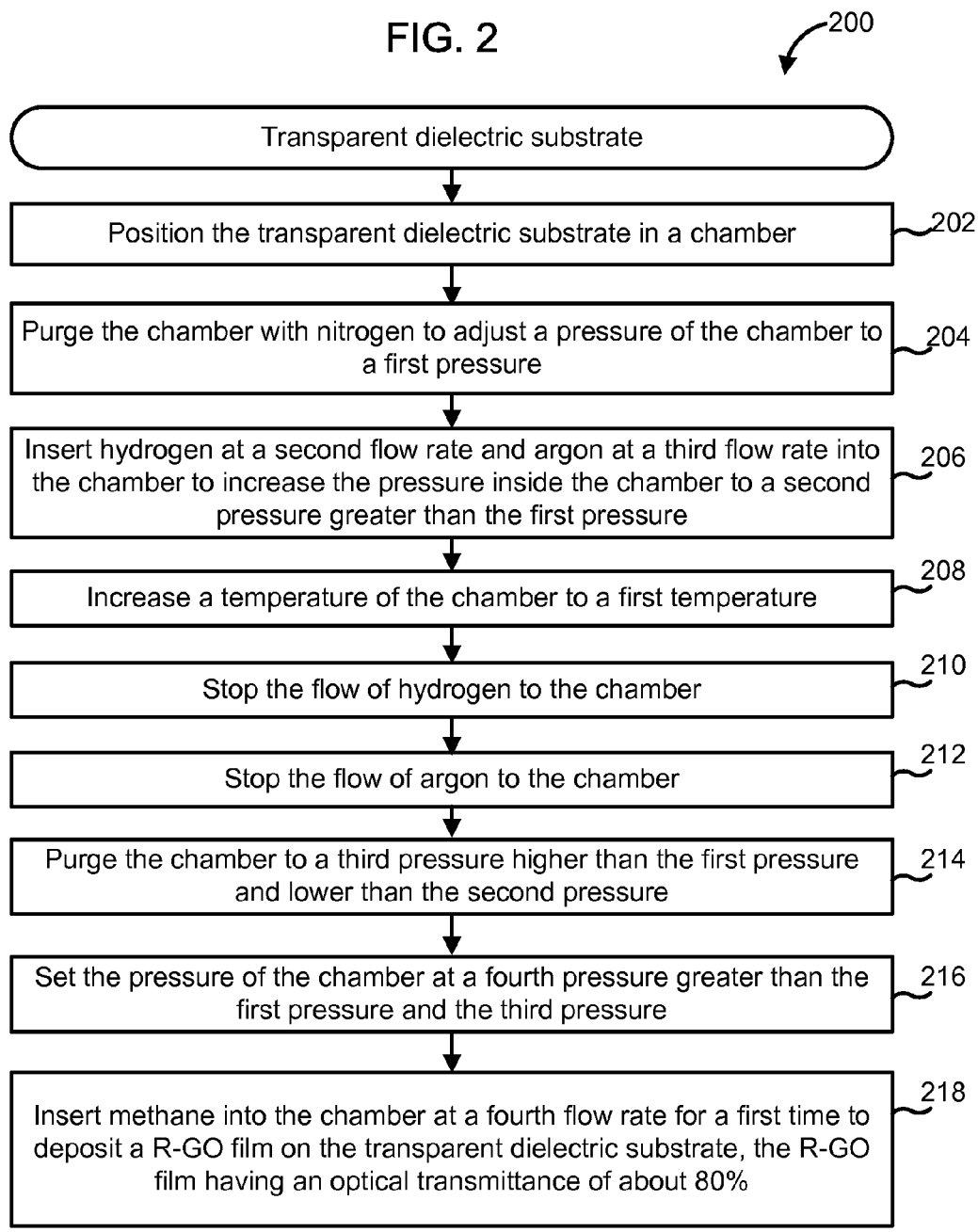
FIG. 2 is a schematic flow diagram of another embodiment of a method for forming a transparent electrode.

The superior optical transmittance and electrical conductivity of the R-GO film can allow the R-GO film to be used as a transparent conducting electrode material, for example for preparing transparent batteries, transparent solar cells, transparent capacitors, etc. For example, FIG. 2 is a schematic flow diagram of an exemplary method 200 for forming a transparent electrode.

Any dielectric substrate which can withstand the maximum temperature reached during the operations included in the method 200 can be used. Suitable dielectric substrates can include, for example, $SiO_2$ quartz, fused silica, silicon nitride, sapphire, magnesium oxide, etc. The dielectric substrate can have any shape or size, for example a block, a sheet, a wafer (e.g., a 2 inch, 3 inch, 4 inch, 6 inch, 12 inch or even larger wafer), contoured shape or any other suitable shape or size which can be fit inside a chamber, as described herein.

The method 200 includes positioning a transparent dielectric substrate in a chamber at 202. The chamber can include, for example a CVD chamber or a CVD tube as is commonly known in the arts. The transparent dielectric substrate can include, for example silicon, fused silica, quartz, silicon nitride or any other suitable transparent dielectric substrate.

The chamber is purged with a nitrogen to adjust a pressure of the chamber to a first pressure at 204. In particular embodiments, the first pressure can be in the range of 5 mTorr to 100 mTorr (e.g., 5 mTorr, 6 mTorr, 7 mTorr, 8 mTorr, 9 mTorr, 10 mTorr, 12 mTorr, 14 mTorr, 16 mTorr, 18 mTorr, 20 mTorr, 30 mTorr, 40 mTorr, 50 mTorr, 60 mTorr, 70 mTorr, 80 mTorr, 90 mTorr or 100 mTorr inclusive of all ranges and values therebetween). In one embodiment, the first pressure is about 10 mTorr.

Hydrogen is inserted at a second flow rate and argon is inserted at a third flow rate into the chamber to increase the pressure of the chamber to a second pressure which is greater than the first pressure at 206. Each of the first flow rate and the second flow rate can be in the range of 500 sccm to 2,000 sccm (e.g., 500 sccm, 600 sccm, 700 sccm, 800 sccm, 900 sccm, 1,000 sccm, 1,100 sccm, 1,200 sccm, 1,300 sccm, 1,400 sccm, 1,500 sccm, 1,600 sccm, 1,700 sccm, 1,800 sccm, 1,900 sccm or 2,000 sccm inclusive of all ranges and values therebetween). In one embodiment, the first flow rate of the second gas, and the second flow rate of the third gas are about 1,000 sccm. Furthermore, the second pressure can be in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values therebetween). In one embodiment, the second pressure is about 300 Torr.

A temperature of the chamber is increased to a first temperature at 208. In some embodiments, the first temperature is in the range of 800 degrees Celsius to 1,200 degrees Celsius (e.g., 800, 850, 900, 950, 1,000, 1,100, 1,150 or 1,200 degrees Celsius inclusive of all ranges and values therebetween). In one embodiment, the first temperature is about 950 degrees Celsius.

The flow of the hydrogen into the chamber is stopped at 210. Furthermore, the flow of the argon into the chamber is stopped at 212. The chamber is purged to a third pressure which is higher than the first pressure and is lower than the second pressure at 214. In some embodiments, the third pressure is 500 mTorr to 5 Torr (e.g., 500 mTorr, 600 mTorr, 700 mTorr, 800 mTorr, 900 mTorr, 1 Torr, 2 Torr, 3 Torr, 4 Torr or 5 Torr inclusive of all ranges and values therebetween). In one embodiment, the third pressure is about 1 Torr.

The pressure of the chamber is set to a fourth pressure which is greater than the first pressure and the third pressure at 216. In some embodiments, the fourth pressure is in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values therebetween). In particular embodiments, the fourth pressure is the same as the second pressure. In one embodiment, the second pressure is about 300 Torr.

Methane is inserted into the chamber at a fourth flow rate for a first time at 218, which results in deposition of a predetermined thickness of R-GO on the transparent dielectric substrate. The fourth flow rate of the fourth gas can be 800 sccm to 1,200 sccm (e.g., 800 sccm, 850 sccm, 900 sccm, 950 sccm, 1,000 sccm, 1,050 sccm, 1,100 sccm, 1,150 sccm, or 1,200 sccm inclusive of all ranges and values therebetween). In one embodiment, the fourth flow rate is about 1,000 sccm. The first time can be in the range of about 30 seconds. The first time and the fourth flow rate can be varied to deposit an R-GO film having a thickness of 5 nm on the transparent dielectric substrate. The R-GO film has an optical transmittance of at least 80% at a thickness of up to about 5 nm.

In some embodiments, method 200 can also include reducing the fourth flow rate of the methane to a fifth flow rate lower than the fourth flow rate. For example, the fifth flow rate can be in the range of about 50 sccm to about 150 sccm (e.g., about 50 sccm, 60 sccm, 70 sccm, 80 sccm, 90 sccm, 100 sccm, 110 sccm, 120 sccm, 130 sccm, 140 sccm or 150 sccm inclusive of all ranges and values there between). The fifth flow rate is maintained for a second time to deposit the 5 nm thick film of the electrically conductive R-GO on the transparent dielectric substrate.

Figure 3:
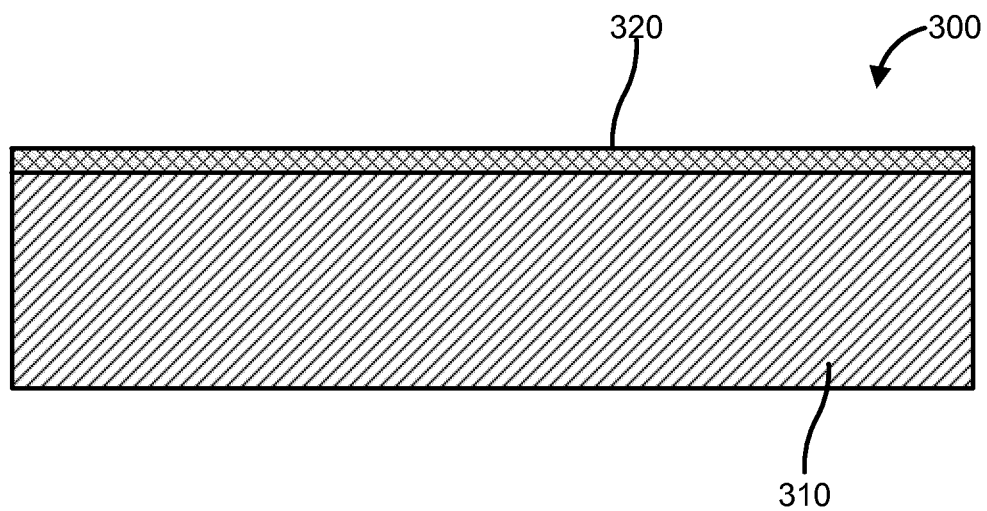
FIG. 3 is a schematic illustration of a side cross-section of yet another embodiment of a transparent electrode that includes a conductive and optically transparent R-GO film deposited on a dielectric substrate.

In this manner, a transparent electrode which includes a dielectric substrate and a transparent film of electrically conductive R-GO disposed thereon is obtained. For example, FIG. 3 is a side cross-section of a transparent electrode 300 which can be formed using the method 200. The transparent electrode 300 includes a transparent dielectric substrate 310 (e.g., $SiO_2$, quartz, fused silica, silicon nitride, sapphire, magnesium oxide, etc.) and an R-GO film 320 disposed thereon. The R-GO film 320 can have a thickness of about 5 nm and an optical transmittance of at least 80% at the thickness.

The R-GO film 320 can be composed of clusters of carbon having in the range of 45% to 70% sp3 bonding. The optical transmittance has only a weak dependence on the optical wavelength. The sheet resistance of the R-GO film 320 can approach that of a pristine multilayer graphene and can be in the range of 5 kOhm/square to 10 kOhm/square (e.g., 5, 6, 7, 8, 9 or 10 kOhm/square inclusive of all ranges and values therebetween). Furthermore, the R-GO film 320 has a thermal conductivity in the range of 60 W/m-K to 120 W/m-K (e.g., 60, 70, 80, 90, 100, 110 or 120 W/m-K inclusive of all ranges and values therebetween). In particular embodiments, the R-GO film has a thermal conductivity of 91.4±21.7 W/m-K.

The transparent electrode 300 can be used in any suitable electronic device. For example, the transparent electrode 300 can be used in an electrochemical cell for conducting redox reactions, a battery electrode (e.g., a transparent battery), a capacitor (e.g., in a transparent capacitor), an inductor, etc.

Figure 4:
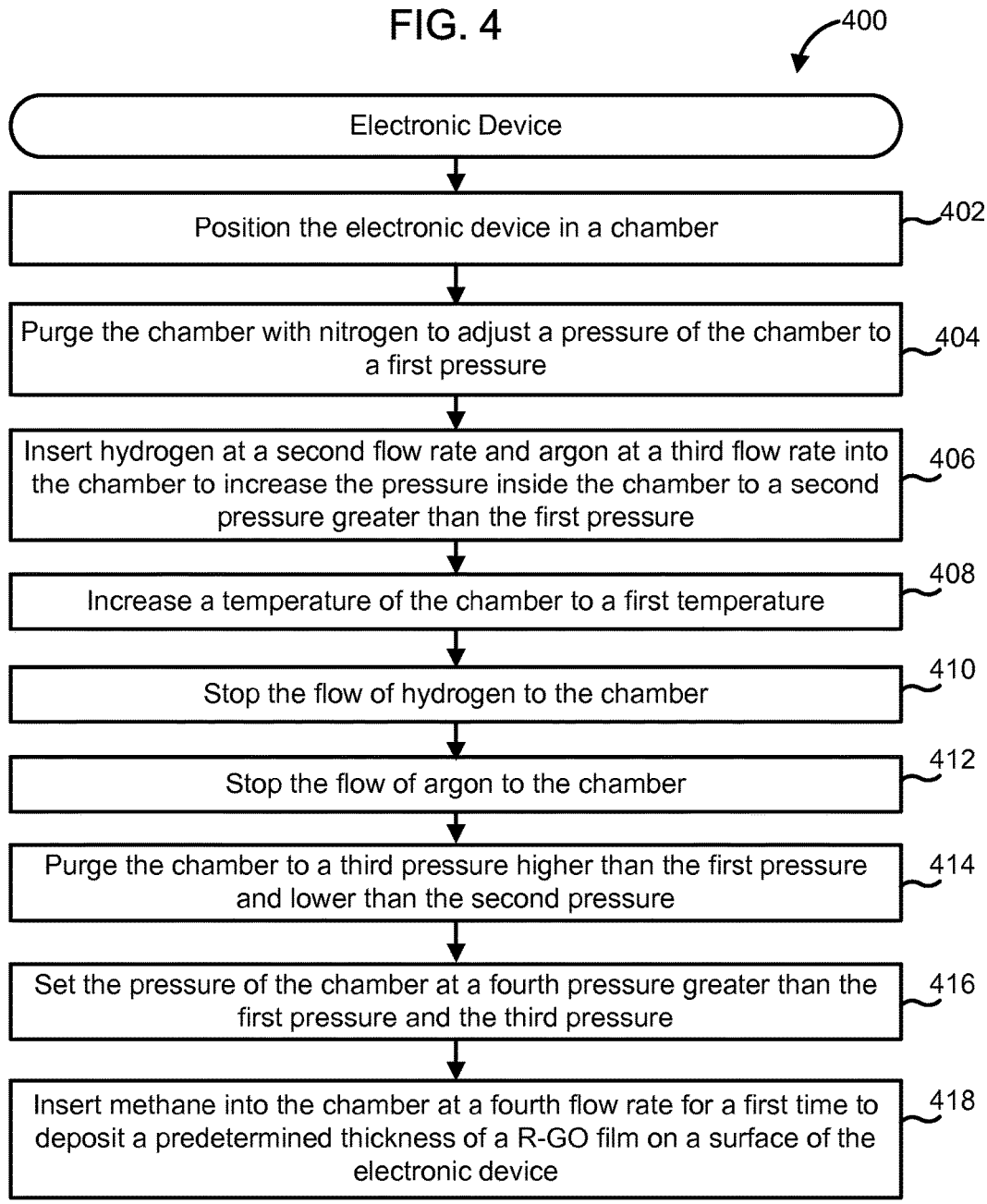
FIG. 4 is a schematic flow diagram of still another embodiment of a method for enhancing heat transfer from an electronic device by depositing a R-GO film on the electronic device.

The high thermal conductivity of the R-GO film formed using the methods described herein can be used for enhancing heat transfer from devices, for example the surface of an electronic device. For example, FIG. 4 is a schematic flow diagram of an exemplary method 400 for enhancing heat transfer form an electronic device by depositing a R-GO film on the electronic device. The electronic device can include, for example, p-n junction devices (e.g., solar cells, photocells, diodes, tunnel diodes, zener diodes, LEDs), PIN diodes, transistors, metal oxide semi-conductor field effect transistors (MOSFET), sensors (e.g., Hall effect sensors), integrated circuits, charge coupled devices (CCDs), ROMs, RAMs, etc. A surface of the electronic device can include a dielectric. For example, the electronic device can include an in silico electronic device (e.g., an integrated circuit) formed on a $Si/SiO_2$ substrate and/or at least a portion of the electronic device can be passivated with a dielectric (e.g., $SiO_2$).

To deposit the R-GO film, the electronic device is positioned in a chamber at 402. The chamber can include a CVD chamber as described before herein. The chamber is purged with nitrogen to adjust a pressure of the chamber to a first pressure at 404. In particular embodiments, the first pressure can be in the range of 5 mTorr to 100 mTorr (e.g., 5 mTorr, 6 mTorr, 7 mTorr, 8 mTorr, 9 mTorr, 10 mTorr, 12 mTorr, 14 mTorr, 16 mTorr, 18 mTorr, 20 mTorr, 30 mTorr, 40 mTorr, 50 mTorr, 60 mTorr, 70 mTorr, 80 mTorr, 90 mTorr or 100 mTorr inclusive of all ranges and values there between). In one embodiment, the first pressure is about 10 mTorr.

Hydrogen is inserted at a second flow rate and argon is inserted at a third flow rate into the chamber to increase the pressure of the chamber to a second pressure which is greater than the first pressure at 406. Each of the first flow rate and the second flow rate can be in the range of 500 sccm to 2,000 sccm (e.g., 500 sccm, 600 sccm, 700 sccm, 800 sccm, 900 sccm, 1,000 sccm, 1,100 sccm, 1,200 sccm, 1,300 sccm, 1,400 sccm, 1,500 sccm, 1,600 sccm, 1,700 sccm, 1,800 sccm, 1,900 sccm or 2,000 sccm inclusive of all ranges and values there between). In one embodiment, the first flow rate of the second gas, and the second flow rate of the third gas are about 1,000 sccm. Furthermore, the second pressure can be in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values therebetween). In one embodiment, the second pressure is about 300 Torr.

A temperature of the chamber is increased to a first temperature at 408. In some embodiments, the first temperature is in the range of 800 degrees Celsius to 1,200 degrees Celsius (e.g., 800, 850, 900, 950, 1,000, 1,050, 1,100, 1,150 or 1,200 degrees Celsius inclusive of all ranges and values there between). In one embodiment, the first temperature is about 950 degrees Celsius.

The flow of the hydrogen into the chamber is stopped at 410. Furthermore, the flow of the argon into the chamber is stopped at 412. The chamber is purged to a third pressure which is higher than the first pressure and is lower than the second pressure at 414. In some embodiments, the third pressure is 500 mTorr to 5 Torr (e.g., 500 mTorr, 600 mTorr, 700 mTorr, 800 mTorr, 900 mTorr, 1 Torr, 2 Torr, 3 Torr, 4 Torr or 5 Torr inclusive of all ranges and values there between). In one embodiment, the third pressure is about 1 Torr.

The pressure of the chamber is set to a fourth pressure which is greater than the first pressure and the third pressure at 416. In some embodiments, the fourth pressure is in the range of 250 Torr to 350 Torr (e.g., 250 Torr, 260 Torr, 270 Torr, 280 Torr, 290 Torr, 300 Torr, 310 Torr, 320 Torr, 330 Torr, 340 Torr or 350 Torr inclusive of all ranges and values therebetween). In particular embodiments, the fourth pressure is the same as the second pressure. In one embodiment, the second pressure is about 300 Torr.

Methane is inserted into the chamber at a fourth flow rate for a first time at 418, which results in deposition of a predetermined thickness of R-GO on a surface the electronic device. The fourth flow rate of the fourth gas can be 800 sccm to 1,200 sccm (e.g., 800 sccm, 850 sccm, 900 sccm, 950 sccm, 1,000 sccm, 1,050 sccm, 1,100 sccm, 1,150 sccm, or 1,200 sccm inclusive of all ranges and values there between). In one embodiment, the fourth flow rate is about 1,000 sccm. The first time can be in the range of about 30 seconds. The first time and the fourth flow rate can be varied to deposit a predetermined thickness of the R-GO film on the surface of the electronic device. The R-GO film has a thermal conductivity in the range of 60 W/m-K to 120 W/m-K (e.g., thermal conductivity of 91.4±21.7 W/m-K) which enhances heat transfer from the electronic device. In some embodiments, the R-GO film has a sheet resistance of 5 kOhm/square to 10 kOhm/square. Furthermore, the R-GO film can have an optical transmittance of at least 80% at a film thickness of up to about 5 nm.

In some embodiments, the method 400 can also include reducing the fourth flow rate of the methane to a fifth flow rate lower than the fourth flow rate. For example, the fifth flow rate can be in the range of about 50 sccm to about 150 sccm (e.g., about 50 sccm, 60 sccm, 70 sccm, 80 sccm, 90 sccm, 100 sccm, 110 sccm, 120 sccm, 130 sccm, 140 sccm or 150 sccm inclusive of all ranges and values there between). The fifth flow rate is maintained for a second time to deposit the predetermined thickness of the R-GO film on a surface of the electronic device.

Figure 5:
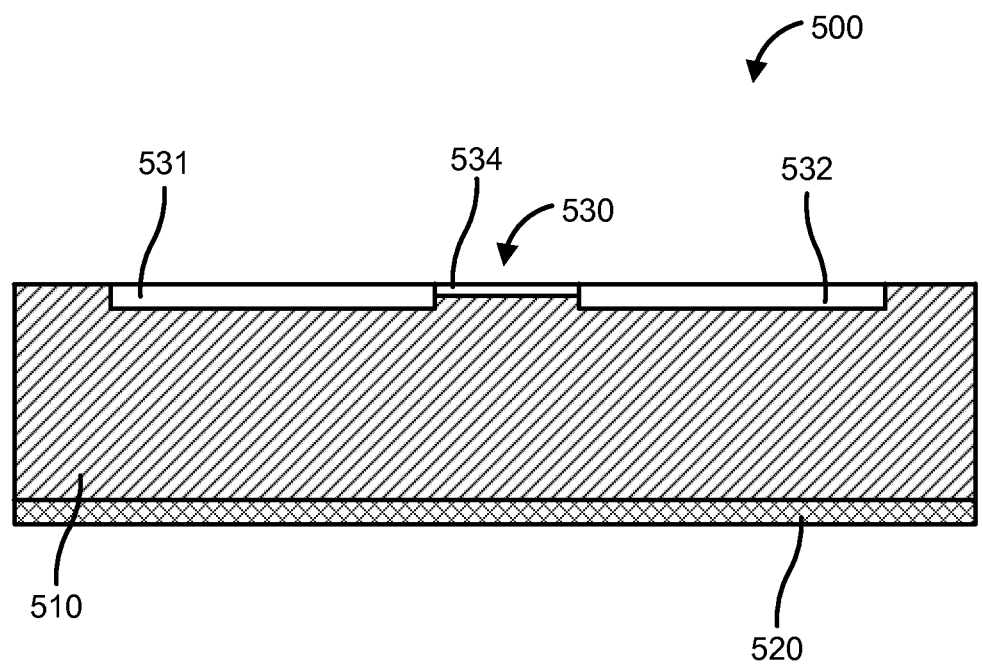
FIG. 5 is a schematic illustration of a particular embodiment of an electronic device that includes a R-GO film disposed on a surface of the electronic device to increase heat transfer from the electronic device.

As described before, the R-GO film formed using the method 100 can be deposited on any electronic device to enhance heat transfer therefrom. FIG. 5 is a schematic illustration of a side cross-section of an electronic device 500. The electronic device includes a substrate 510 (e.g., a $Si/SiO_2$ substrate) with an electronic circuit 530 formed therein. The electronic circuit 530 includes a field-effect transistor (FET) including a source region 531, a drain region 532 and a gate 534. An R-GO film is deposited on a first surface of the substrate 510 opposite the electronic circuit 530 using the method 400. The R-GO film has a thermal conductivity in the range of 60 W/m-K to 120 W/m-K (e.g., thermal conductivity of 91.4±21.7 W/m-K) which enhances heat transfer from the electronic device 500.

While FIG. 5 shows the R-GO film coated on the first surface of the substrate 510, in some embodiments, the R-GO film can also be deposited on a second surface of the substrate which includes the electronic device 530. In such embodiments, the electronic circuit can be passivated or otherwise insulated with a dielectric material (e.g., $SiO_2$ or $Si_2N_3$, sapphire, magnesium oxide, etc.) which is first coated over the electronic circuit 530. The R-GO film can be coated on top of the passivating dielectric layer. Traditional lithography and wet or dry etching processes can be used to define windows in the R-GO film and the dielectric layer positioned between the R-GO film and the electronic circuit to allow electronic access to the source region 531, drain region 532 and gate 534 of the FET 530.

EXPERIMENTAL EXAMPLES

Synthesis of R-GO Films: Fused silica substrates were placed in a wafer boat in a CVD tube. The tube was purged to 10 mTorr in nitrogen. Then the temperature was ramped to 950 degrees Celsius in 100 sccm $H_2$ and 1,000 sccm Ar, until the tube pressure reaches 300 Torr, then Ar flow is ceased. At 950 degrees Celsius, the $H_2$ flow is ceased and the tube is purged to 1 Torr. The pressure set point is set to 300 Torr, and methane is introduced at 1,000 sccm flow for 30 seconds, followed by 30 seconds of 100 sccm flow. The pressure in the chamber reaches to about 50 Torr during the deposition. Longer flow times at higher pressures results in thicker films.

The same process was followed, with adjusted precursor gas flow durations to tune the film thickness, for the $SiO_2/Si$ and quartz substrates. For all samples the cooling from the deposition step is at 300 Torr and 1,000 sccm hydrogen flow, with an additional 1,000 sccm of argon flowed during the initial ramp to 300 Torr. The samples are removed in nitrogen at 100 degrees Celsius. Some R-GO films were deposited on to copper foil (Alfa Aesar 25 mm, 99.8%) for transfer to TEM grids for thermal and structural characterization.

Preparation of Suspended R-GO Films: For characterization, the R-GO films were grown on a copper foil and transferred from copper to $Si/SiO_2$ substrates for TEM, SAED, and optothermal Raman technique. The copper foil was backside-etched using oxygen plasma reactive ion etching, (100 W, 5 minutes, 164 mTorr, 24 sccm $O_2$). Raman spectroscopy was used to confirm the etching. Ferric chloride acid was used to etch the copper away for about 10 minutes, and a clean piece of $SiO_2/Si$ was submerged into the acid bath to retrieve the R-GO films and place them into water for a minute. The rinse was repeated with two fresh baths of water for a minute each. Then, the characterization substrate ($SiO_2/Si$, TEM grids, quartz) was submerged into the water bath to retrieve the R-GO film. The substrates were baked at 115° C. for several minutes to remove the water. The drying was confirmed with optical microscopy. AFM measurements of the R-GO films deposited on copper foil were carried out after the transfer. For the R-GO films deposited on dielectric substrates, a metallic probe was used to pattern a trench for AFM measurement of the film thickness.

Material Characterization: AFM measurements were performed using Veeco MultiMode 8 Scanning Probe Microscope in ambient air conditions (RH about 30%) using a n-doped silicon tip in tapping mode. The four point probe method was used to determine the sheet resistance (in-kOhm/square) of the R-GO films. A micro-Raman spectrometer with 442 nm excitation at variable power was used to record the Raman spectra on the samples prepared on the TEM grids. The laser power was optimized for lower signal-to-noise ratio and to prevent damage to the samples during the measurement. Scanning electron microscopy (SEM) images were obtained at 5 kV and 5 mm working distance. Light transmittance tests were carried out using a UV/VIS spectrophotometer. SAED was completed on the TEM samples during the TEM. X-ray photoemission spectroscopy (XPS) analysis was performed by a home-built X-ray photoelectron spectrometer, which includes a hemispherical electron energy analyzer of 0.9 eV energy resolution and a non-monochromated Mg K-alpha soft X-ray source at 1,253 eV.

Thickness Control: AFM was used to determine the thickness of the deposited R-GO films. FIG. 6A shows an AFM scan of a surface of the R-GO film and FIG. 6B is a plot of a cross-sectional profile of the R-GO film. The thickness of the R-GO film was found to be tunable via the gas flow rate and deposition time. FIG. 6C shows a plot of thickness of the R-GO film deposited on copper, $SiO_2$ and quartz substrates for various deposition times.

Figure 7A:
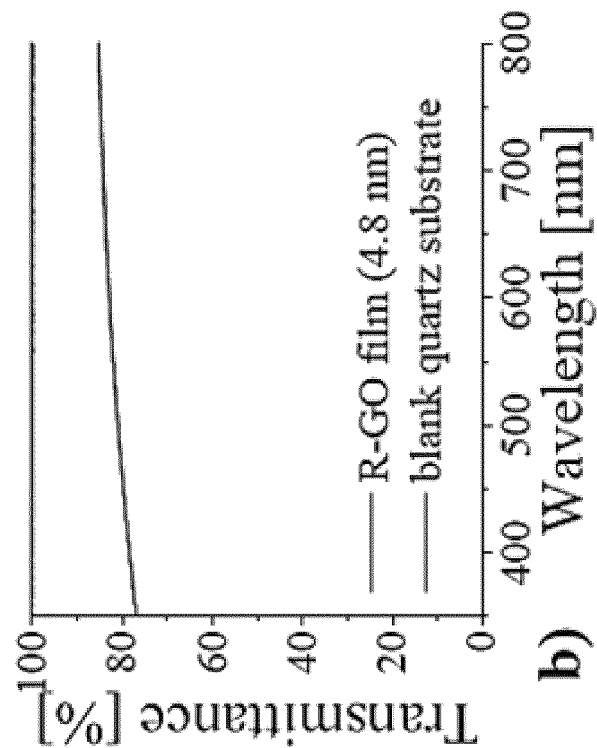
FIG. 7A is a plot of sheet resistance vs optical transmittance at 514 nm optical wavelength of an R-GO film deposited using the method of FIG. 1 relative to a spun R-GO film and a multilayer graphene film.
Figure 7B:
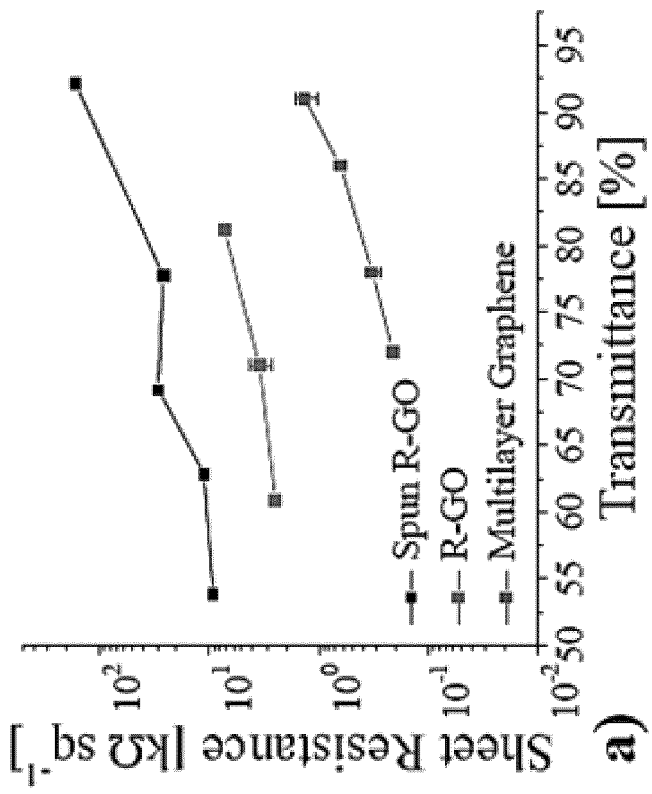
FIG. 7B is a plot of optical transmittance of the R-GO film formed using the method of FIG. 1 at various optical wavelengths.

R-GO Film Characterization: As shown in FIG. 7A, the light transmission of the R-GO films reached a transmittance of 81.2±0.2% at 514 nm for the 4.8±0.5 nm thick film on quartz, with sheet resistance of 7.3±0.8 kOhm/square. The sheet resistance of R-GO approaches that of pristine multi-layer graphene fabricated by CVD on nickel, with only 30-70% of the sheet resistance of the conventional Hummer's method spun R-GO films (FIG. 7A). As shown in FIG. 7B, the UV-visible light transmittance shows only a weak dependence on wavelength similar to graphene films.

Figure 8A:
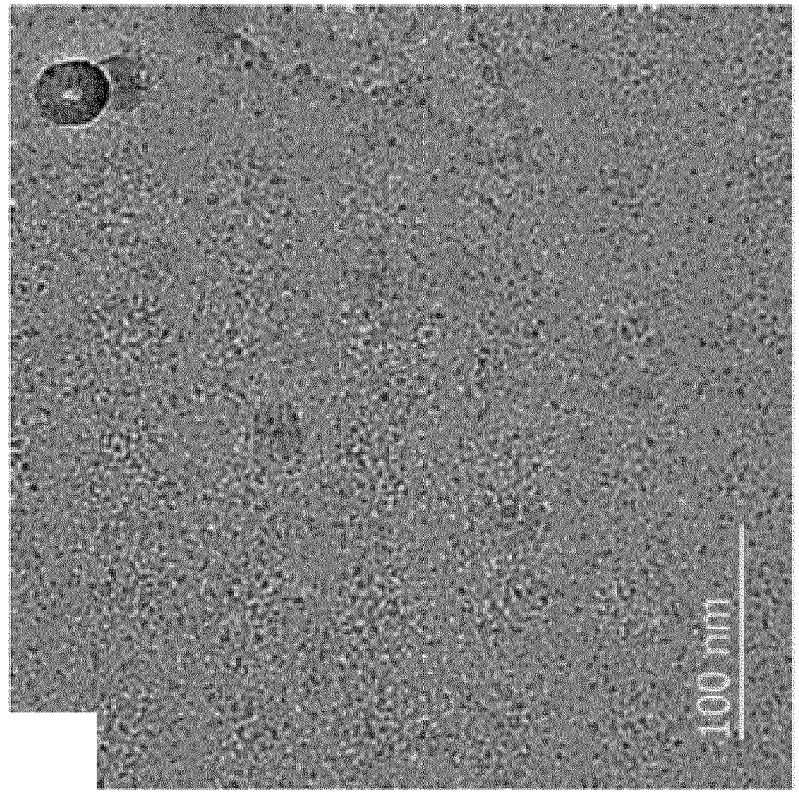
FIG. 8A is a Raman spectra of a 10 nm thick R-GO film formed using the method 100 which is suspended in air on a transmission electron microscopy (TEM) grid.

Raman characterization was carried out on the synthesized R-GO films to probe the presence of graphene or R-GO material structure. The spectrum of graphitic materials is composed of the D, G, and 2D peaks (typically located at about 1,350 per cm, about 1,585 per cm, and about 2,700 per cm respectively). Values for the Raman peak shifts and relative intensities of R-GO vary depending on the degree of reduction, such that the D and G bands are at about 1,350 per cm and about 1,585 per cm for R-GO, whereas for unreduced graphene oxide the G peak is upshifted to 1,599 per cm. As shown on FIG. 8A, the Raman spectra of the produced R-GO films transferred onto TEM grid were for R-GO, with the D peak about 1,350 per cm, the G peak at about 1,585 per cm, and the 2D peak about 2,700 per cm.

Figure 11:
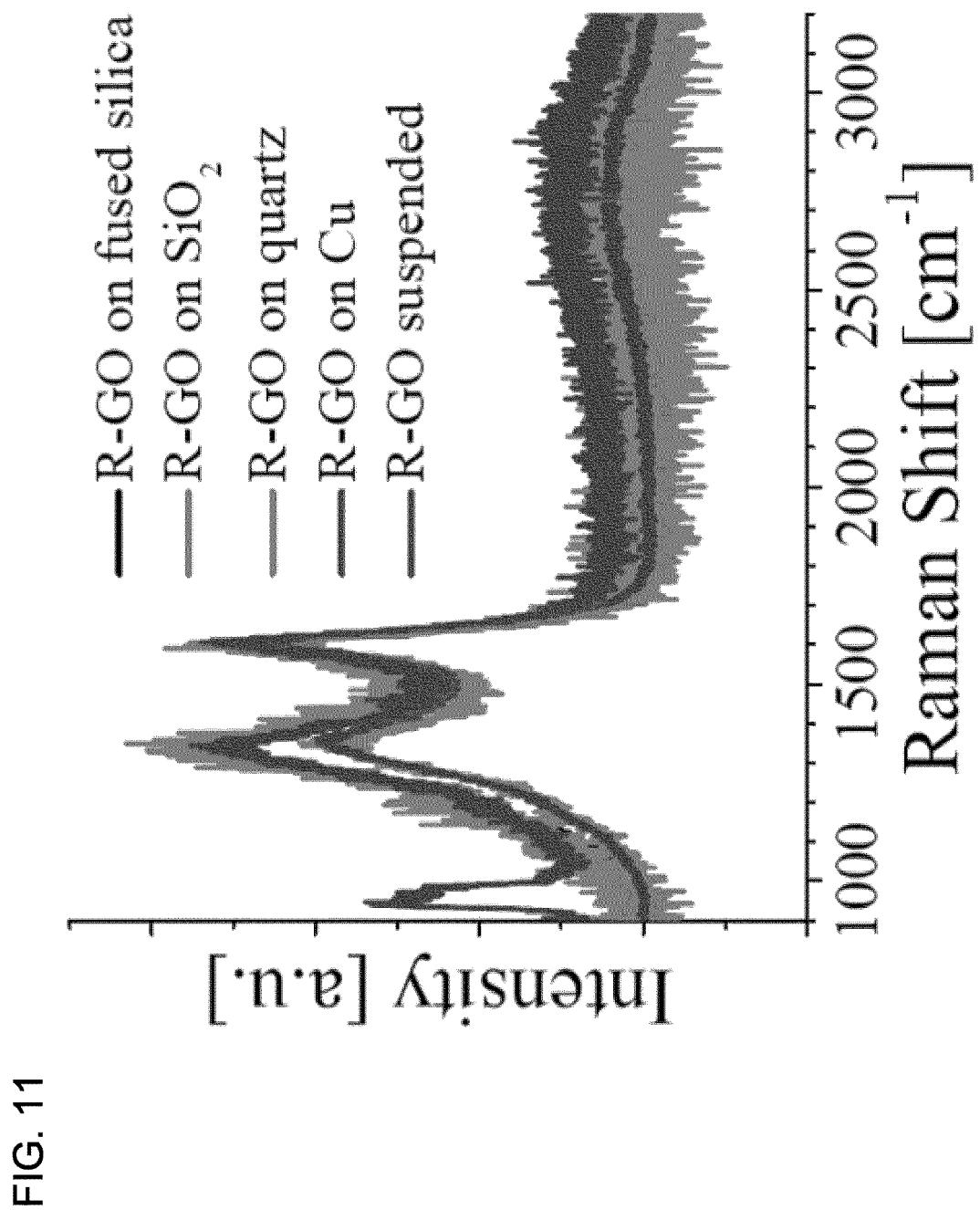
FIG. 11 is a Raman spectra of as deposited R-GO films (30 seconds 1,000 sccm, 30 seconds 100 sccm) on fused silica, $SiO_2$, quartz, Cu substrates and a suspended R-GO film (deposited on Cu then suspended in air on TEM grid) (633 nm excitation); spectra are normalized to intensity of graphitic G peak of suspended R-GO.
Figure 12A:
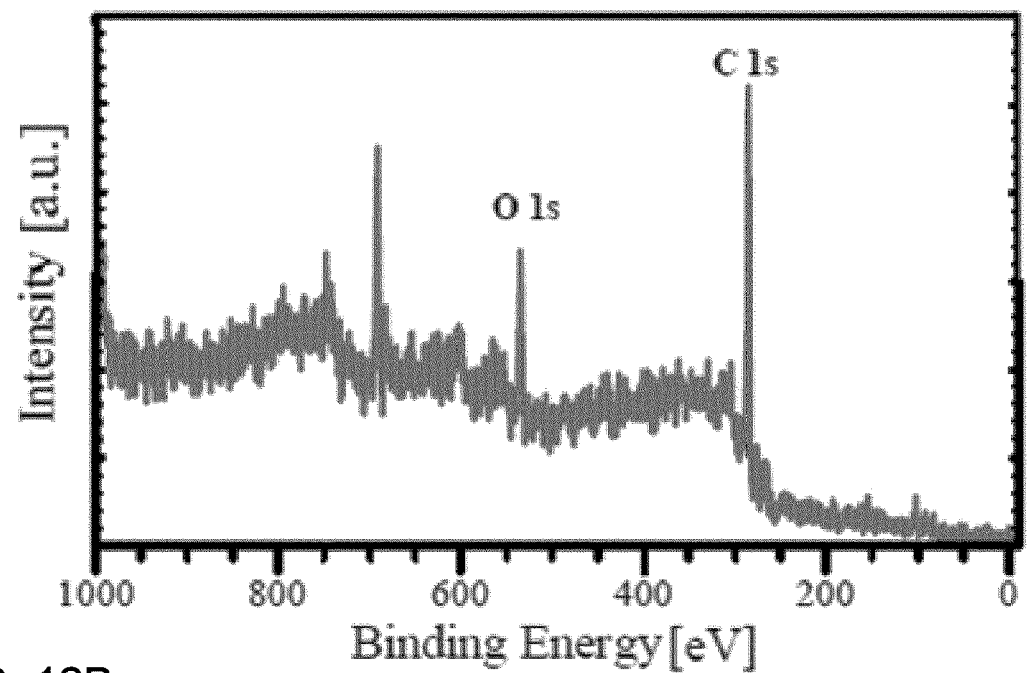
FIG. 12A is a XPS survey scan of R-GO film deposited on the 100 mm fused silica wafer which indicate the presence of oxygen on the surface of R-GO sample.
Figure 12B:
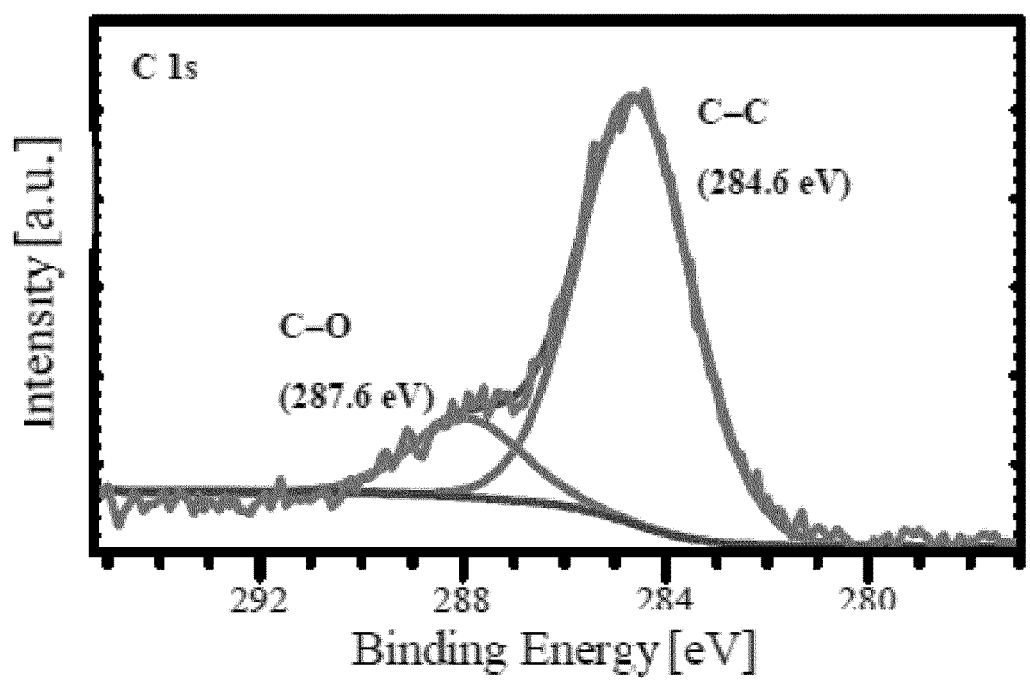
FIG. 12B is a higher-resolution C1s spectra confirming that only small amount of oxygen is bonded to carbon.

Meanwhile, the Raman spectra of the as-deposited R-GO films on various substrates are largely similar to the one suspended in air on TEM grid, though some variation in the relative intensity of D and G peaks was observed with substrate as shown in FIG. 11. This indicates that the material structure of the R-GO film is largely independent of the substrate of deposition. The similarity in chemical composition is further confirmed by XPS analysis carried out on fused silica and Cu substrate, and is shown in FIGS. 12A-B.

Figure 8B:
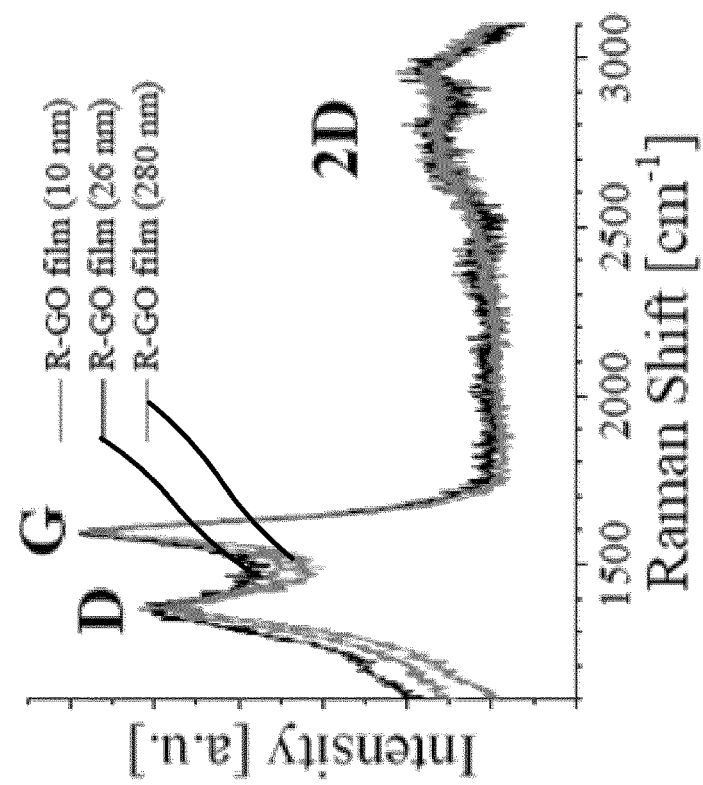
FIG. 8B is a TEM image of the R-GO film.
Figure 9B:
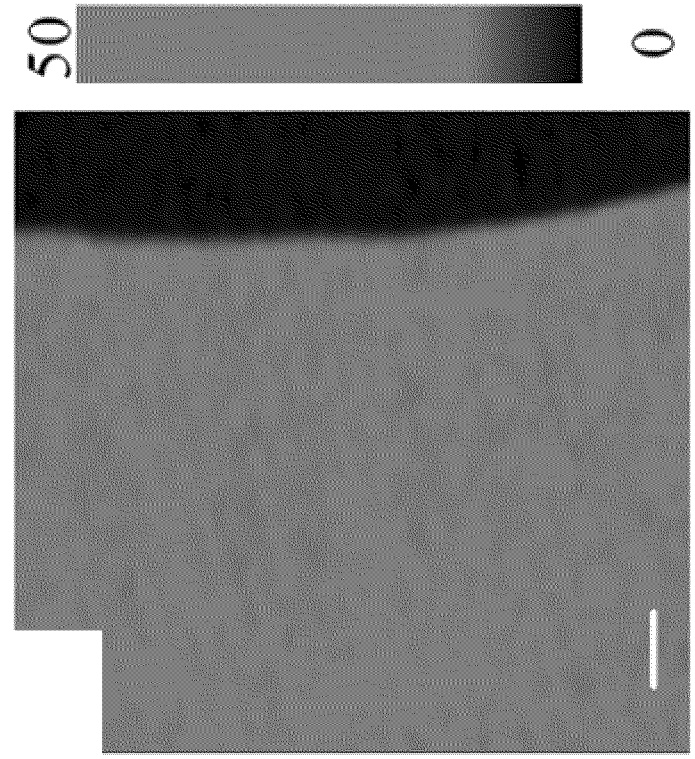
FIG. 9B is an integrated C—K edge scanning transmission x-ray microscopy (STXM) image of a 10 nm thick R-GO film.
Figure 9A:
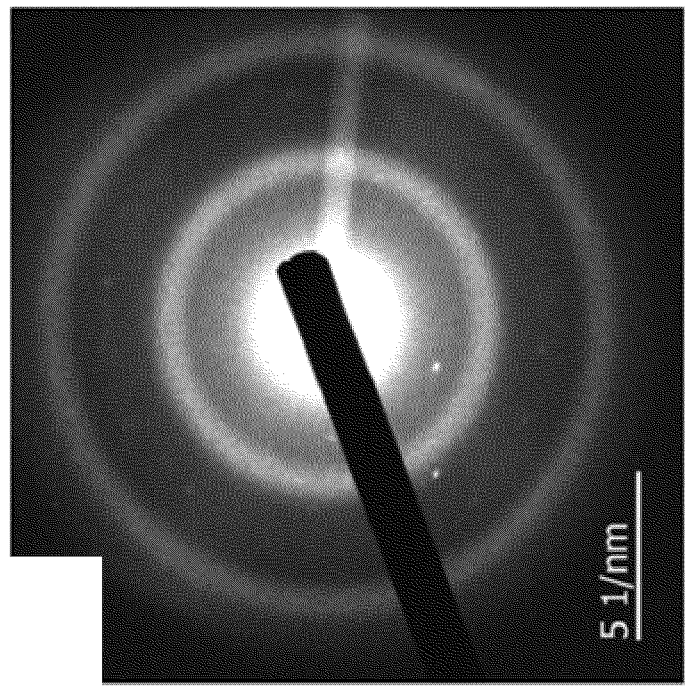
FIG. 9A is a selected area electron diffraction (SAED) pattern of the R-GO film of FIGS. 8A-B.

In order to further determine the R-GO film structure, TEM and selected area electron diffraction (SAED) were carried out on films transferred onto the TEM grids (FIGS. 8B and 9A). From the TEM results, it was observed that the R-GO films are composed of nanoscale clusters of carbon (about 5 nm diameter). The SAED indicates the amorphous nature of carbon films because the spot size for SAED (1 micron) contains many clusters of R-GO. Two R-GO films measured via AFM were found to be 10 nm and 26 nm thick. The films were transferred onto copper TEM grids for electronic structure mapping at the nanoscale by synchrotron based scanning transmission X-ray microscopy (STXM) characterization (FIGS. 9B, 10A-B), a technique which provides high energy resolution to detect the presence of C—H and C—O bonding.

Figure 14:
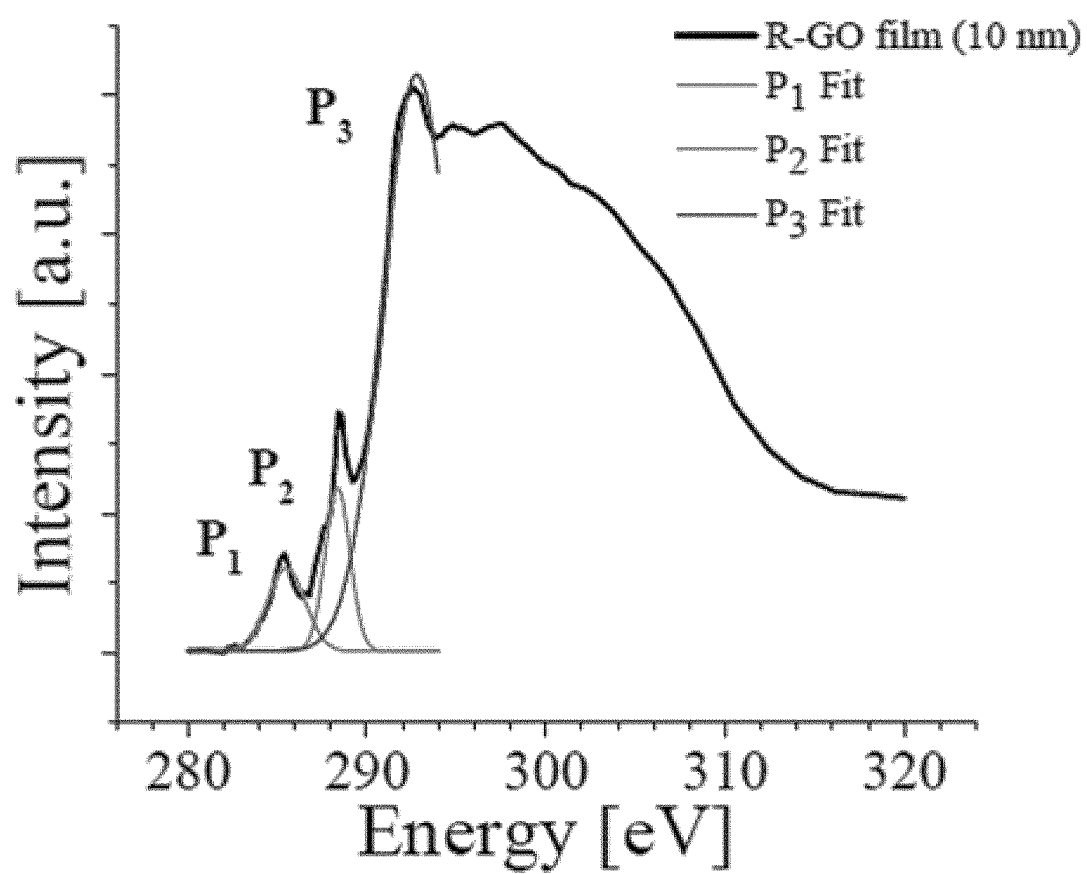
FIG. 14 is a near edge x-ray absorption fine structure (NEXAFS) C—K edge spectra of a suspended 10 nm thick R-GO film.

STXM is also useful for probing the thickness uniformity and sp3 content of the R-GO films. FIG. 14 shows the peak fit of the NEXAFS C—K edge of the suspended 10 nm R-GO film. The relative fraction of sp2 to sp3 carbon bonding has been interpreted from the NEXAFS C—K edge spectra by first defining R, the ratio of the integrated area of the first two peaks, P1 and P2 to the third peak, P3:

$$R = \frac{(P_1 + P_2)}{(P_1 + P_2 + P_3)} \quad (1)$$

Then the R of R-GO ($R_{R-GO}$) is compared to the R of graphite, ($R_{Gr}$) to determine x, the fraction of sp3 bonded carbon content, by:

$$R = R_{Gr}(1-x) \quad (2)$$

The fraction of sp3 bonded carbon content of the R-GO film is converted to a percentage. The 10 nm R-GO film has an STXM thickness of 10 nm with 30% sp3 carbon bonding. The STXM thickness measured for the 26 nm thick R-GO film was 15 nm with 49% sp3 carbon bonding.

FIG. 9B shows the integrated C—K edge STXM image of the 10 nm thick R-GO film between 280-320 eV photon energies. The transmission image is converted to optical density by taking the I/I$_0$ ratio, where I is the photon flux transmitted through the sample, and I$_0$ is the total flux of the incident photo beam measured through a hole or clear region i.e. free of sample close to I. Thickness uniformity of the R-GO film is reflected by the absolute OD distribution as represented by the scale.

Figure 10A:
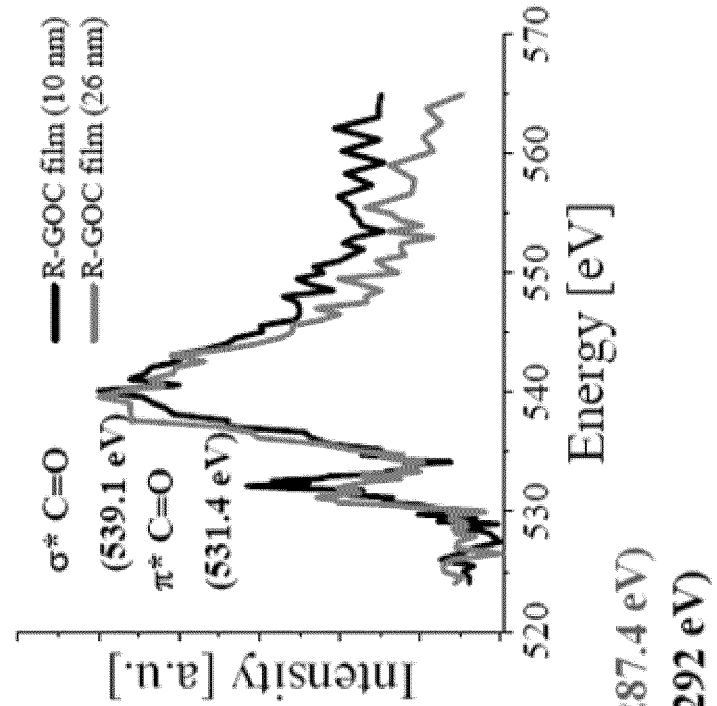
FIG. 10A is a C—K edge spectra and FIG. 10B is an O—K edge spectra of 10 nm and 26 nm thick R-GO films extracted from optical density maps of the respective films.
Figure 10B:
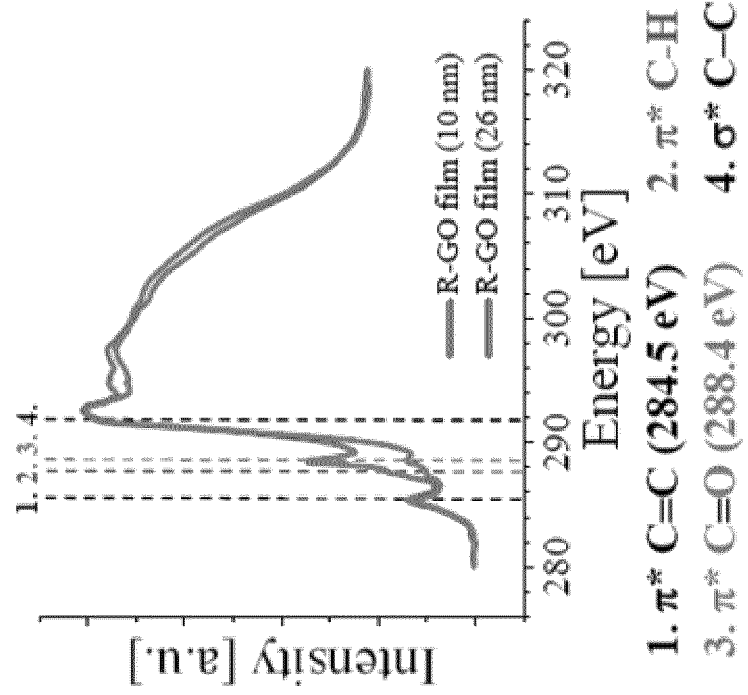

The spatially resolved NEXAFS C—K and O—K edge spectra were extracted from the average OD mapping of the 10 nm and 26 nm R-GO films and normalized as shown in FIGS. 10A-B. The C—K edge of the R-GO samples exhibit a weak $\pi^*(C=C)$ at 284.5 eV and a broad $\sigma^*(C-C)$ transition at 292 eV respectively. Two intermediate spectral features at 287.4 eV and 288.4 eV are observed between the $\pi^*$ and the $\sigma^*$ peak, related to the C—H and C=O moieties in the R-GO. Of particular interest is the thickness dependent C=O feature attributed to oxygen moieties predominantly bonded to the defect rich domains in the R-GO film. The O—K edge is recorded to further understand the nature and concentration of oxygen in the carbon matrix. The O—K edge also exhibits a strong $\pi^*(C=O)$ resonance at 531.4 eV and $\sigma^*(C-O)$ resonance at 539.1(±0.1) eV. The relative intensities of the $\pi^*(C=O)$ resonance both in the C—K and O—K edges are consistent with the concentration of oxygen in the R-GO films. A strong correlation between the nature and distribution of the carbon and oxygen bonds may be inferred from their relative peak intensities.

Table I gives the STXM measured thicknesses of the R-GO films, as well as the relative integrated area of $\pi^*C=O$ bond peaks and the % sp3 bonded carbon content of the R-GO films as measured from the C—K and O—K edges. The integrated area of the $\pi^*$ C=O bond peak of 10 nm thick film is assigned unity. The sp3 bonded carbon content increases with film thickness, and the oxygen bonding content decreases with increasing film thickness. This change in oxygen bonding content suggests that the oxygen content of the R-GO films may originate mainly from the copper substrate surface rather than from contamination in the CVD process gases.

TABLE I

NEXAFS analysis of R-GO films with STXM measured film thickness

| Film | Thickness (nm) | I$_\pi$* C=O (288.4 eV) | I$_\pi$* C=O (531.4 eV) | % sp3 |
|---|---|---|---|---|
| R-GO (10 nm) | 10 | 1 | 1 | 30 |
| R-GO (26 nm) | 15 | 0.44 | 0.90 | 49 |

Figure 15A:
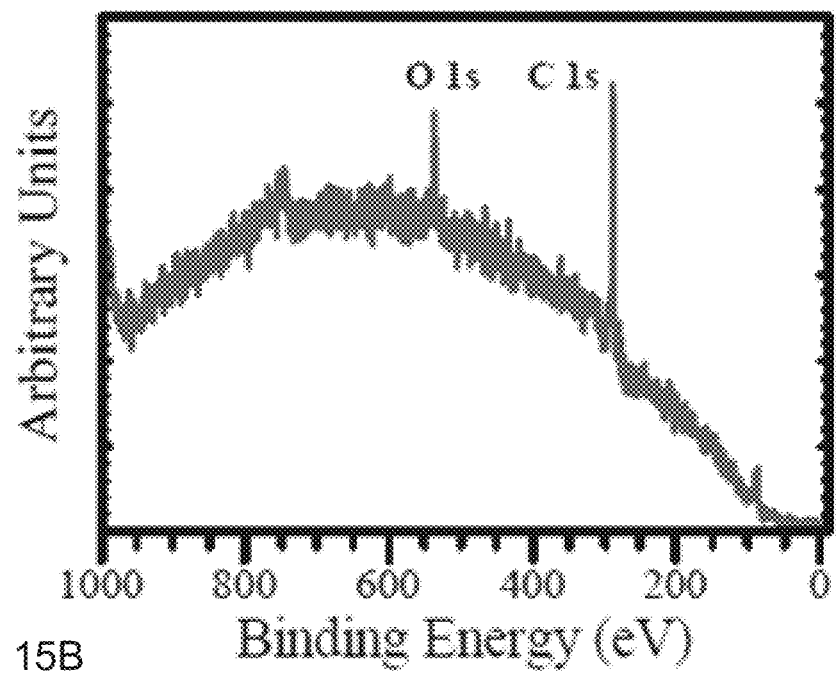
FIG. 15A is a x-ray photoelectron spectroscopy (XPS) survey scan of a R-GO film deposited on Cu and then transferred onto Au/SiO$_2$/Si substrate.
Figure 15B:
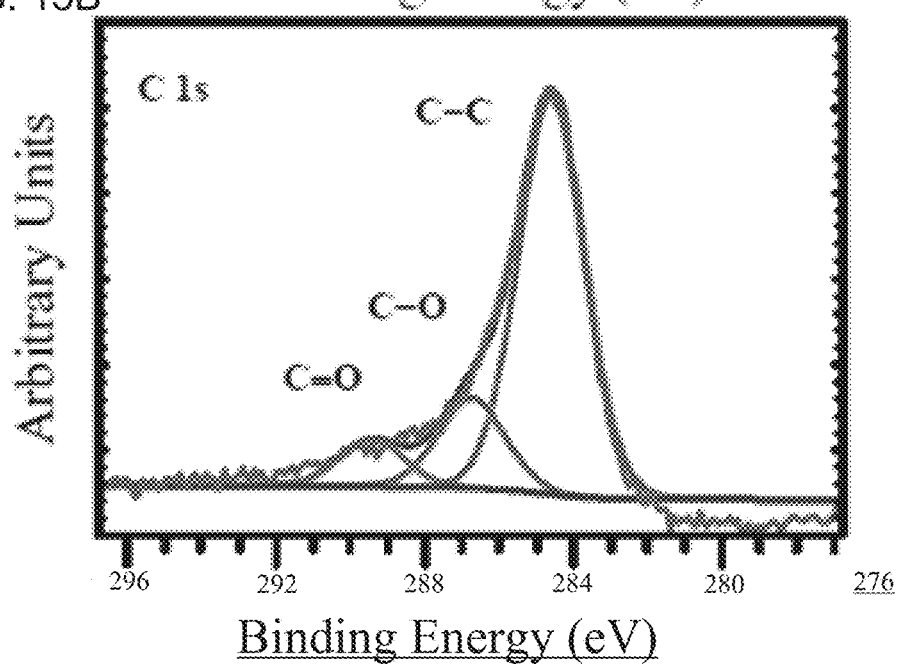
FIG. 15B is a higher resolution plot of the XPS spectra of FIG. 15A, which confirm that the R-GO film deposited on Cu foil has a similar oxygen content (14.5 atom %) and carbon bonding to those deposited on fused silica.

FIG. 12A-B show X-ray photon spectroscopy (XPS) analysis of the R-GO film deposited on the 100 mm diameter fused silica wafer. The survey scan (FIG. 12A) indicates the presence of oxygen on the surface of the sample in very small amount (17.7 atomic % of oxygen in comparison to 82.3 atomic % of carbon). The high-resolution C1s spectrum indicates that most of the carbon forms C—C bonds (at 284.6 eV) while only small amount of oxygen is bonded to carbon, as indicated by C—O peak at 287.6 eV. Such a small oxygen amount can be primarily bonded to carbon at the defect sites. There was little variation in the XPS spectra with the substrate of deposition. FIG. 15A-B shows XPS spectra of R-GO deposited on copper, then transferred onto Au/SiO$_2$/Si substrate, confirming that the substrate of deposition has little influence on the chemical composition of the R-GO film (see Table II).

TABLE II

XPS analysis of R-GO films

| Substrate | R-GO Film Thickness (nm) | Atomic % O | Atomic % C |
|---|---|---|---|
| Fused silica | 7.8 | 17.7 | 82.3 |
| Copper | 10 | 14.5 | 85.5 |

Figure 13A:
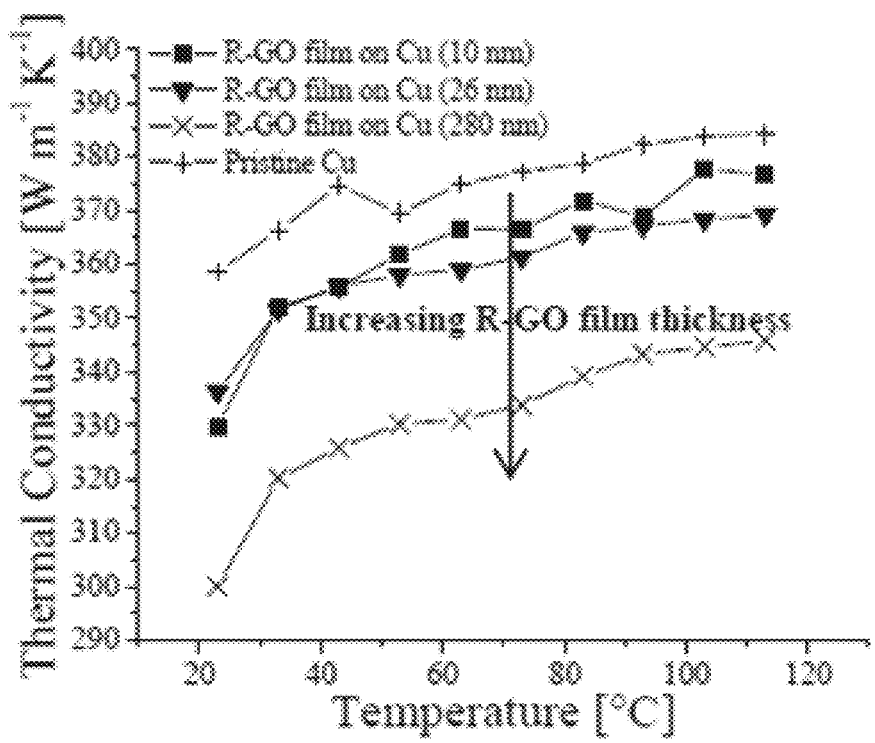
FIG. 13A is a plot of in-plane thermal conductivity of R-GO-copper composites including various R-GO film thicknesses measured by laser flash technique (LFT) and laser flash calorimetry (LFC)

Several R-GO films of varying thickness were deposited onto copper and the apparent in-plane thermal conductivity of the entire structure was measured by combining the laser flash technique (LFT) for diffusivity and laser flash calorimetry (LFC) for heat capacity (FIG. 13A). The thermal conductivity of the R-GO-Copper composite decreases with increasing R-GO film thickness from the neat copper value. This trend indicates that the thermal conductivity of the R-GO films is less than that of copper (300 W/m-K to 400 W/m-K at room temperature, depending on the grain size and film thickness).

To further illuminate the thermal properties of the R-GO films, the optothermal technique developed for suspended graphene films was conducted on the suspended R-GO film in air. The optothermal technique is a steady state method to determine the thermal conductivity of a material. A laser of known power and beam spot diameter, r$_0$, is used to create a point source of heat on the suspended film of diameter R and thickness t. The transmittance of the R-GO film to light is 72.1% at 514 nm. This means only about ⅕$^{th}$ of the power of the incident monochromatic laser (514 nm) is absorbed. Because the film size is large (50 μm×50 μm) compared to the beam spot (0.7 μm diameter) and the film is suspended in air, it is appropriate to apply a uniform 2-dimensional radial heat equation to solve for the thermal conductivity, K, according to Equation (1):

$$K = \ln\frac{\frac{R}{r_o}}{2\pi t R_g} \tag{1}$$

where Rg is given by Equation (2):

$$R_g = \frac{T_m - T_o}{Q} \tag{2}$$

Figure 13B:
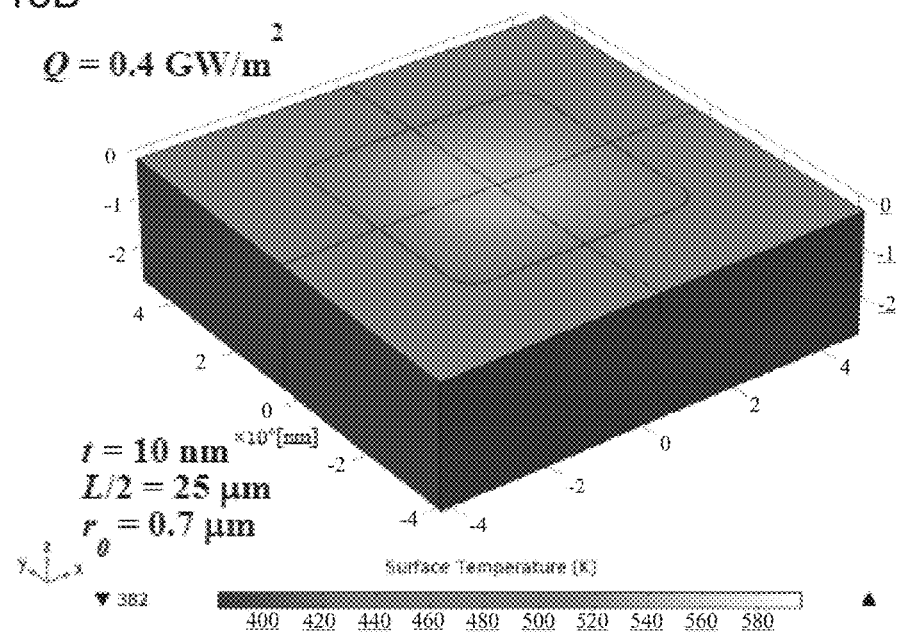
FIG. 13B is a computer simulated model of surface temperature of a 10 nm thick R-GO film suspended on a copper grid with a side length L=50 microns and exposed to a 0.4 GW/m$^2$ power laser having a beam spot radius $r_o$=0.7 microns.

The analytical data extraction was checked with the finite element simulations using the COMSOL® Multiphysics software tools (FIG. 13B). In these simulations, the laser heating of equal magnitude as the experiment is applied, and the thermal conductivity is varied until the element simulation was 124.5±36.6 W/m-K. The results obtained with the finite element simulations fall within the range of the experimental uncertainty of the empirical measurements of the thermal conductivity. For practical implementation of R-GO as a transparent conducting film, maximizing the optical transmittance while minimizing the sheet resistance of the film is beneficial. The R-GO films formed using the methods described herein have exceptional electrical conductivity and optical transmittance (FIGS. 7A-B).

Another application requirement is scalability of the growth process. A shown in FIGS. 7A-B, R-GO films coated on dielectric substrates using the methods described herein have significant advantaged over multilayer graphene and solution processed R-GO films, as R-GO may be deposited directly onto the dielectric substrates over a large area, without a prolonged anneal (e.g., several hours) at high temperature, for example in range of 1,000 to 1,100 degrees Celsius. For the purpose of demonstrating the large area growth, the deposition of R-GO was also carried out on 100 mm fused silica wafers. The films have similar electrical and optical properties as the smaller-scale films grown on 1"×1" substrates.

Furthermore, in consideration of applying a film as a lateral heat spreader, a film with exceptional in-plane thermal conductivity is preferred. The LFT/LFC results indicated that the R-GO films have lower thermal conductivity than copper. The optothermal results elucidate that the film has excellent thermal conductivity, 91.4±21.7 W/m-K. This measured thermal conductivity is about 1,000 times higher than that of amorphous carbon films about 10 times greater than that of bulk ITO films and about 28 times greater than the one for ITO films of similar thickness and optical transmittance. This exceptional thermal conductivity may be increased further through the addition of a high temperature annealing step.

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

What is claimed is:

1. A method for coating a dielectric substrate with a reduced graphene oxide film, comprising:
    positioning the dielectric substrate in a chamber, the dielectric substrate being free of graphene oxide or a metallic catalyst;
    depositing the reduced graphene oxide as a uniform layer directly on the dielectric substrate by:
        purging the chamber with a first gas to adjust a pressure of the chamber to a first pressure;
        inserting a second gas at a second flow rate and a third gas at a third flow rate into the chamber to increase the pressure inside the chamber to a second pressure, the second pressure greater than the first pressure;
        increasing a temperature of the chamber to a first temperature;
        stopping the flow of the second gas onto the chamber;
        stopping the flow of the third gas into the chamber;
        purging the chamber to a third pressure, the third pressure higher than the first pressure and lower than the second pressure;
        setting the pressure of the chamber at a fourth pressure, the fourth pressure greater than the first pressure and the third pressure; and
        inserting a fourth gas into the chamber at a fourth flow rate for a first time period,
    wherein the reduced graphene oxide film comprises clusters of carbon having sp3 bonding in the range of 45% to 70%.

2. The method of claim 1, further comprising:
    reducing the fourth flow rate of the fourth gas to a fifth flow rate; and
    maintaining the fifth flow rate for a second time period.

3. The method of claim 1, wherein the dielectric substrate includes at least one of silicon oxide, silicon nitride, quartz, sapphire, magnesium oxide, and fused silica.

4. The method of claim 1, wherein the first gas is nitrogen.

5. The method of claim 1, wherein second gas is hydrogen, and wherein the third gas is argon.

6. The method of claim 1, wherein the second pressure is in the range of 250 Torr to 350 Torr.

7. The method of claim 1, wherein the first temperature is in the range of 800 degrees Celsius to 1,200 degrees Celsius.

8. The method of claim 1, wherein the third pressure is about 1 Torr.

9. The method of claim 1, wherein the fourth gas is at least one of methane, ethylene and ethane.

10. The method of claim 1, wherein the reduced graphene oxide film has an optical transmittance of at least 80% at a thickness of up to about 5 nm.

11. The method of claim 1, wherein the reduced graphene oxide film has a sheet resistance of 5 kOhm/square to 10 kOhm/square.

12. The method of claim 1, wherein the reduced graphene oxide film has a thermal conductivity in the range of 60 W/m-K to 120 W/m-K.

13. A method for forming a transparent electrode, comprising:
    providing a transparent dielectric substrate, the dielectric substrate being free of graphene oxide or a metallic catalyst;
    positioning the transparent dielectric substrate in a chamber;

purging the chamber with nitrogen to adjust a pressure of the chamber to a first pressure;

inserting hydrogen at a second flow rate and argon at a third flow rate into the chamber to increase the pressure inside the chamber to a second pressure, the second pressure greater than the first pressure;

increasing a temperature of the chamber to a first temperature;

stopping the flow of hydrogen into the chamber;

stopping the flow of argon into the chamber;

purging the chamber to a third pressure, the third pressure higher than the first pressure and lower than the second pressure;

setting the pressure of the chamber at a fourth pressure, the fourth pressure greater than the first pressure and the third pressure; and inserting methane into the chamber at fourth flow rate for a first time period to deposit a predetermined thickness of an electrically conductive reduced graphene oxide film as a uniform layer directly on the transparent dielectric substrate, wherein the reduced graphene oxide film has a thermal conductivity in the range of 60 W/m-K to 120 W/m-K, and wherein the reduced graphene oxide film comprises clusters of carbon having sp3 bonding in the range of 45% to 70%.

14. The method of claim 13, wherein the fourth flow rate is in the range 800 sccm to 1,200 sccm and, wherein the fourth pressure is in the range of 250 Torr to 350 Torr.

15. The method of claim 13, wherein the reduced graphene oxide film has a sheet resistance of 5 kOhm/square to 10 kOhm/square.

16. The method of claim 14, further comprising:

reducing the flow rate of the fourth gas to a fifth flow rate; and maintaining the fifth flow rate for a second time period to deposit the electrically conductive reduced graphene oxide film on the transparent dielectric substrate.

17. A method of enhancing heat transfer from an electronic device, comprising:

depositing a reduced graphene oxide film as a uniform layer directly on a dielectric substrate of the electronic device, the dielectric substrate being free of graphene oxide and a metallic catalyst, the reduced graphene oxide film deposited by:

positioning the electronic device in a chamber;

purging the chamber with nitrogen to adjust a pressure of the chamber to a first pressure;

inserting hydrogen at a second flow rate and argon at a third flow rate into the chamber to increase the pressure inside the chamber to a second pressure, the second pressure greater than the first pressure;

increasing a temperature of the chamber to a first temperature;

stopping the flow of hydrogen into the chamber;

stopping the flow of argon into the chamber;

purging the chamber to a third pressure, the third pressure higher than the first pressure and lower than the second pressure;

setting the pressure of the chamber at a fourth pressure, the fourth pressure greater than the first pressure and the third pressure; and inserting methane into the chamber at fourth flow rate for a first time period to deposit a predetermined thickness of a reduced graphene oxide film on a surface of the electronic device, wherein, the reduced graphene oxide film has a thermal conductivity in the range of 60 W/m-K to 120 W/m-K.

18. The method of claim 17, wherein the reduced graphene oxide film has an optical transmittance of at least 80% at a thickness of up to about 5 nm.

19. The method of claim 17, wherein the reduced graphene oxide film has a sheet resistance of 5 kOhm/square to 10 kOhm/square.

20. The method of claim 13, wherein the reduced graphene oxide film has an optical transmittance of at least 80% at a thickness of up to about 5 nm.

* * * * *